United States Patent
Sekigawa et al.

(10) Patent No.: US 7,282,959 B2
(45) Date of Patent: Oct. 16, 2007

(54) CMOS CIRCUIT INCLUDING DOUBLE-INSULATED-GATE FIELD-EFFECT TRANSISTORS

(75) Inventors: Toshihiro Sekigawa, Ibaraki (JP); Hanpei Koike, Ibaraki (JP); Yongxun Liu, Ibaraki (JP); Meishoku Masahara, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 175 days.

(21) Appl. No.: 11/072,401

(22) Filed: Mar. 7, 2005

(65) Prior Publication Data
US 2005/0199964 A1 Sep. 15, 2005

(30) Foreign Application Priority Data
Mar. 11, 2004 (JP) ............................. 2004-069789

(51) Int. Cl.
*H03K 19/094* (2006.01)
(52) U.S. Cl. ....................................... 326/121; 326/31
(58) Field of Classification Search ................ 326/112, 326/119, 121, 122, 31, 34; 327/534, 535
See application file for complete search history.

(56) References Cited

U.S. PATENT DOCUMENTS 5,466,961 A * 11/1995 Kikuchi et al. ............. 257/379
5,748,016 A * 5/1998 Kurosawa .................... 327/108
6,469,568 B2 * 10/2002 Toyoyama et al. .......... 327/534
6,677,803 B1 * 1/2004 Chiba ......................... 327/534

FOREIGN PATENT DOCUMENTS

JP 63-217718 A 9/1988

* cited by examiner

*Primary Examiner*—James H. Cho
(74) *Attorney, Agent, or Firm*—Rader, Fishman & Grauer PLLC

(57) ABSTRACT

It is an object of the present invention to provide a CMOS circuit implemented using four-terminal double-insulated-gate field-effect transistors, in which the problems described above can be overcome. Another object of the present invention is to reduce power consumption in a circuit unit that is in an idle state or ready state, i.e., to reduce static power consumption. The two gate electrodes of a P-type four-terminal double-insulated-gate field-effect transistor are electrically connected to each other and are electrically connected to one of the gate electrodes of an N-type four-terminal double-insulated-gate field-effect transistor, whereby an input terminal of a CMOS circuit is formed, and a threshold voltage of the N-type four-terminal double-insulated-gate field-effect transistor is controlled by controlling a potential of the other gate of the N-type four-terminal double-insulated-gate field-effect transistor.

20 Claims, 6 Drawing Sheets

CMOS CIRCUIT INCLUDING DOUBLE-INSULATED-GATE FIELD-EFFECT TRANSISTORS

TECHNICAL FIELD OF THE INVENTION

The present invention relates to double-insulated-gate field-effect transistors, particularly to a CMOS circuit including four-terminal double-insulated-gate field-effect transistors.

DESCRIPTION OF RELATED ART

Generally, the mobility of holes in a P-type insulated-gate field-effect transistor (PMOST) is less than the mobility of electrons in an N-type insulated-gate field-effect transistor (NMOST). Thus, when a CMOS circuit is formed using insulated-gate field-effect transistors (MOSTs), in order to adjust currents associated with a PMOST and an NMOST, the channel width (width of the flow of currents) of the PMOST must be about twice as large as the channel width of the NMOST.

This causes increase in the area of a chip and is disadvantageous in forming an integrated circuit. This is particularly disadvantageous in a four-terminal double-insulated-gate field-effect transistor (FIG. 6) in which a source region S, a drain region D, and a channel region are provided in a thin, fin-shaped silicon layer vertically standing on a substrate, in which gate oxide films are provided on both sides of the silicon layer, and in which gate electrodes 1 and 2 are electrically insulated from each other.

This is because in the structure described above, the width of the channel width is determined by the height of the fin, which is usually the same as those for all four-terminal double-insulated-gate field-effect transistors provided on the same substrate. Thus, in order to increase the channel width, a plurality of fins must be provided. Furthermore, since the channel width can be increased only to integer multiples, this poses considerable restrictions in circuit design and circuit layout.

Furthermore, in a CMOS circuit, threshold voltages must be suitably chosen for a PMOST and an NMOST, respectively. As is well known, in a four-terminal double-insulated-gate field-effect transistor, a PMOST and an NMOST are formed of gate electrode materials having different work functions, respectively, requiring different manufacturing processes (refer to patent documents mentioned below). If it is possible to set suitable threshold voltages using a single type of electrode material, manufacturing processes can be simplified and manufacturing costs can be reduced. This, however, is not usually the case, and the absolute value of one of the threshold voltages becomes too small, or the absolute values of both the threshold voltages become too large. This is described, for example, in Japanese Unexamined Patent Application Publication No. 2002-270850 and Japanese Unexamined Patent Application Publication No. 2003-163356.

SUMMARY OF THE INVENTION

It is an object of the present invention to provide a CMOS circuit implemented using four-terminal double-insulated-gate field-effect transistors, in which the problems described above can be overcome. Another object of the present invention is to reduce power consumption in a circuit unit that is in an idle state or ready state, i.e., to reduce static power consumption.

The two gate electrodes of a P-type four-terminal double-insulated-gate field-effect transistor are electrically connected to each other and are electrically connected to one of the gate electrodes of an N-type four-terminal double-insulated-gate field-effect transistor, whereby an input terminal of a CMOS inverter circuit is formed, and a threshold voltage of the N-type four-terminal double-insulated-gate field-effect transistor is controlled by controlling a potential of the other gate of the N-type four-terminal double-insulated-gate field-effect transistor. Furthermore, the same gate electrode material with which a suitable threshold voltage is set for the P-type four-terminal double-insulated-gate field-effect transistor is used for the gate electrodes of the N-type four-terminal double-insulated-gate field-effect transistor, and similar control is exercised.

Furthermore, the threshold voltage of the N-type four-terminal double-insulated-gate field-effect transistor is controlled dynamically, causing the threshold voltage to be higher than usual when the transistor is in the idle state or in the ready state. This serves to reduce leakage current, and to reduce the static power consumption of a circuit unit including the transistor.

Since the mobility of holes differs from the mobility of electrons, when a CMOS circuit is implemented using insulated-gate field-effect transistors (MOSTs), the channel width (width of the flow of current) of a PMOST must be about twice as large as the channel width of an NMOST in order to adjust currents associated with the PMOST and NMOST. This causes an increase in a chip area. According to the present invention, however, the chip areas of a PMOST and an NMOST can be substantially the same, and the amounts of current associated with the PMOST and NMOST can also be the same.

Furthermore, it is possible to control a threshold voltage dynamically using one gate of an N-type four-terminal double-insulated-gate field-effect transistor.

BRIEF DESCRIPTION OF THE DRAWINGS

The present inventions will now be described by way of example with reference to the following Figures, in which.

DESCRIPTION OF THE DRAWINGS

Description of the invention will be given below. Operations and advantages of circuits according to the present invention will be described with reference to FIG. 1.

Generally, in a four-terminal double-insulated-gate field-effect transistor, it is possible to control the channel surfaces of the respective channels to be conductive or non-conductive according to the potentials of the respective gate electrodes. Thus, in the circuit shown in FIG. 1, when the value of the potential of VTC is chosen so that the channel surface of a gate electrode GN2 of TN1 is constantly non-conductive, TN1 can be controlled according to the potential of a gate electrode GN1 so that only the channel associated with the gate electrode GN1 is conductive or non-conductive. On the other hand, when gate electrodes GP1 and GP2 are electrically connected to each other so that GP1 and GP2 are at the same potential, as in the case of TP1, both the channels are simultaneously conductive or non-conductive.

That is, when the channel widths of TP1 and TN1, determined by the chip structures, are denoted by WP and WN, the channel width of TP1 is substantially twice WP, and the channel width of TN1 is substantially WN.

Usually, it is advantageous in terms of a chip area, chip layout, or chip manufacturing processes to choose values so that WP is equal to WN (WP=WN). According to the present invention, even when the values are chosen so that WP is equal to WN (WP=WN), the channel width of TP1 is substantially twice the channel width of TN1. This prevents an increase in chip area due to the low mobility in the PMOST TP1, and serves to eliminate restrictions relating to chip layout or the complexity of manufacturing processes in the conventional art.

The advantages and operations can be obtained in a case where threshold voltages of TP1 and TN1 are set using electrode materials having different work functions, and are also true of a case where the same electrode material is used for TP1 and TN1 to simplify manufacturing processes.

In that case, the electrode material is chosen so that the threshold voltage of TP1 will be suitable. Then, usually, the threshold voltage for TN1 becomes too high, causing problems in circuit operation.

Figure 1:
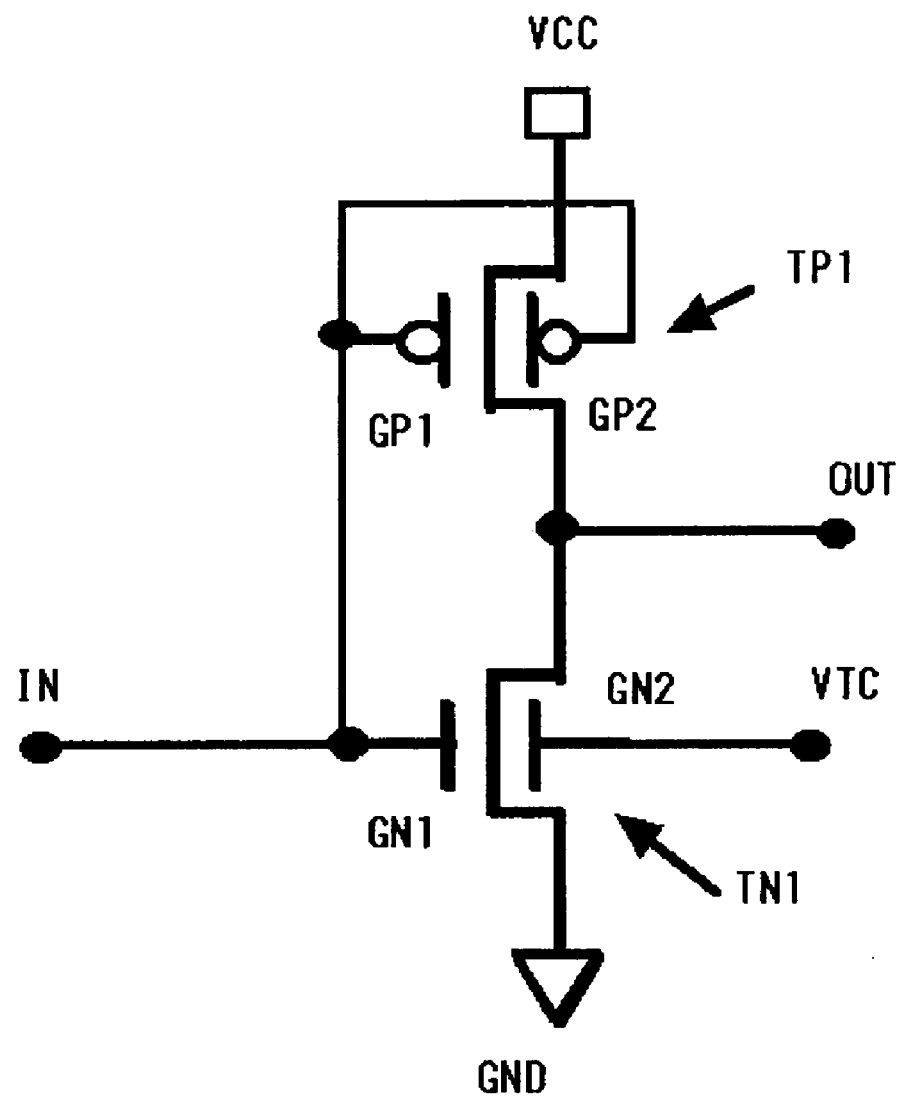
FIG. 1 is a circuit diagram of a CMOS inverter circuit according to a first embodiment of the present invention.

In the circuit according to the present invention, shown in FIG. 1, however, the threshold voltage of TN1 can be controlled according to the value of the potential VTC that is applied to the gate electrode GN2, so that the circuit is allowed to operate appropriately.

Figure 2:
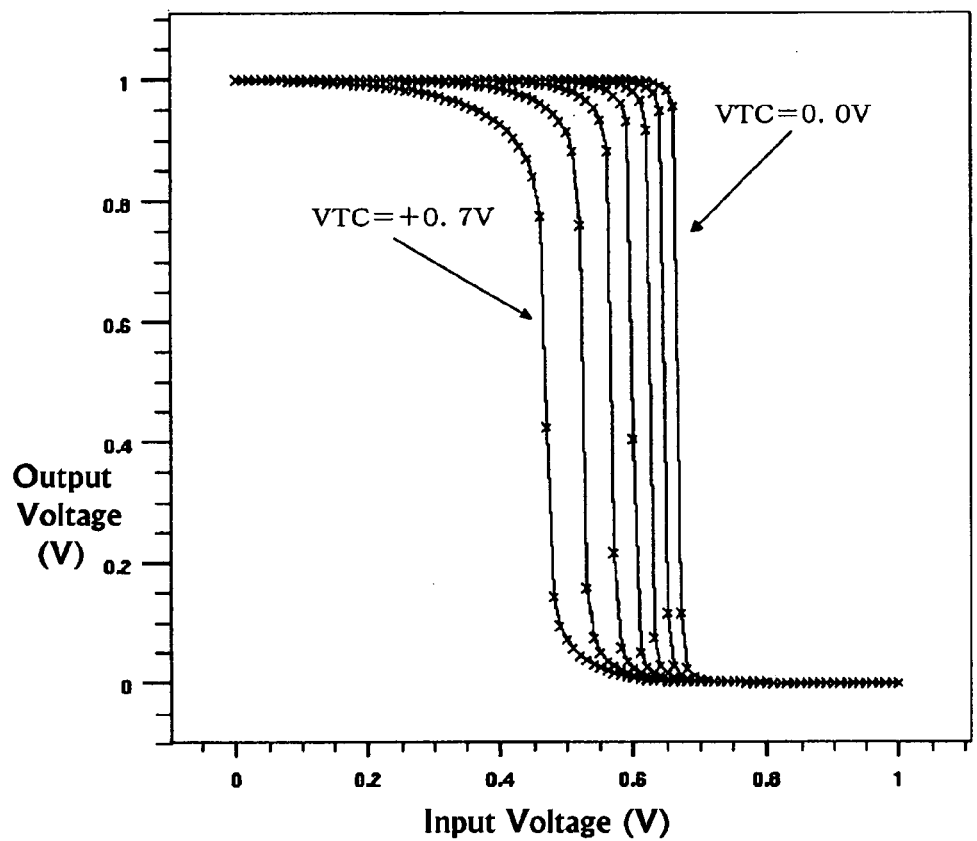
FIG. 2 is a graph showing input/output characteristics calculated for the first embodiment.

As an example, FIG. 2 shows input/output characteristics of the CMOS inverter circuit shown in FIG. 1. As a common gate electrode material, molybdenum silicide (having a work function of approximately 4.80 eV) is used. The power supply voltage VCC is 1 V. The rightmost curve represents a case where VTC is 0 V. The leftmost curve represents a case where VTC is +0.7 V. The curves in the middle represent cases where VTC is increased by steps of 0.1 V from right to left. When VTC is 0 V the threshold voltage of TN1 is too high and the input/output characteristics are too much shifted to the high-potential side. As VTC is gradually increased, the threshold voltage of TN1 decreases, and the input/output characteristics shift to the low input-voltage side. In the case shown in the figure, substantially suitable characteristics are achieved when VTC is +0.6 V to +0.7 V.

Figure 3:
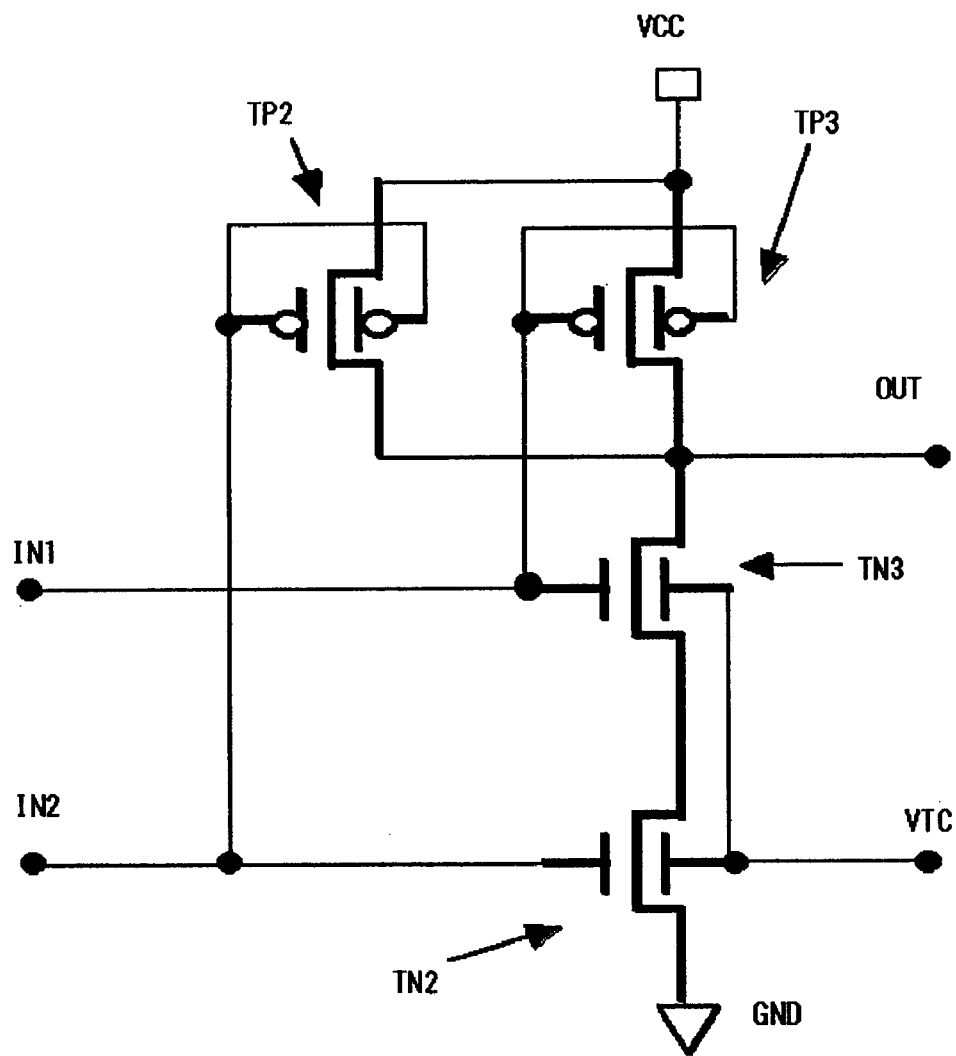
FIG. 3 shows a CMOS NAND circuit according to a second embodiment of the present invention.
Figure 4:
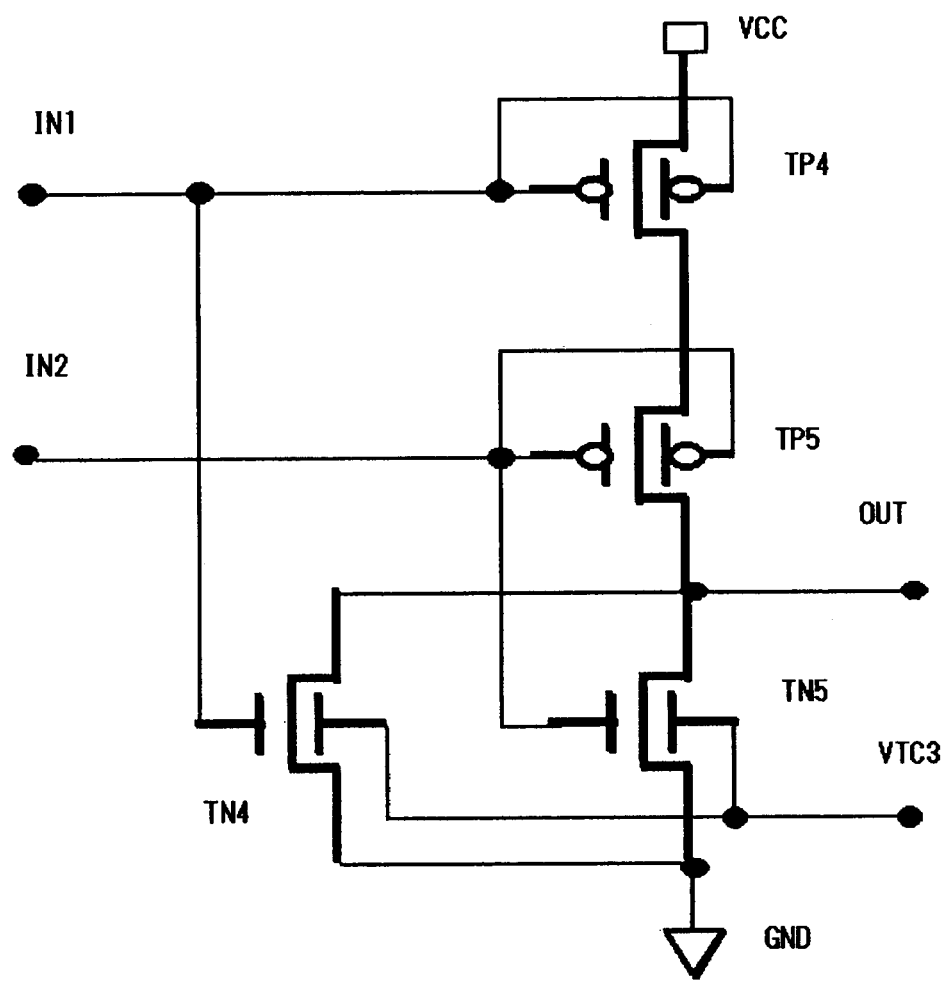
FIG. 4 shows a CMOS NOR circuit according to a third embodiment of the present invention.

FIGS. 3 and 4 show embodiments of a multiple-input NAND gate circuit and a multiple-input NOR circuit that are implemented using the basic configuration shown in FIG. 1.

The potential of the power source VTC in FIGS. 1, 3, and 4 may be dynamically changed in accordance with the operation status of the circuits. When a four-terminal double-insulated-gate field-effect transistor operates with the gate electrodes electrically connected to each other, a value of gate voltage (referred to as a gate swing) that is close to the theoretical limit for changing the amount of drain current by an order of magnitude in an operation range less than or equal to a threshold voltage can be achieved. The value is approximately 60 mV/order of magnitude at room temperature. Drain leakage current in an OFF period can be reduced by a small change in gate voltage as the value becomes smaller.

Regarding this point, when power consumption of the circuit as a whole is reduced by lowering the power supply voltage, a threshold voltage must be reduced accordingly. Then, the disadvantage of increase of leakage current during an OFF period can be alleviated.

For example, TP1 shown in FIG. 1 has this advantage because it operates as described above. On the other hand, when one of the gate electrodes is fixed, as in the case of TN1, the gate amplitude increases, and leakage current during an OFF period easily increases to about twice the ideal value, although the increase depends on the structure.

Thus, when the threshold voltage of TN1 is chosen to be on the order of the absolute value of the threshold of TP1, leakage current that flows when TN1 is OFF considerably increases.

In the embodiment shown in FIG. 1, however, the threshold voltage of TN1 can be controlled according to the potential of VTC. Thus, by choosing a potential that causes the threshold voltage to be high when TN1 is OFF, e.g., 0 V, and a potential that causes the threshold voltage to be low when TN1 is ON, e.g., +0.6 V, the leakage current that flows when TN1 is OFF can be sufficiently reduced without compromising the operation of the circuit.

As described above, in a unit circuit including a plurality of CMOS gates, the potential of VTC is lowered when the unit circuit is in the idle state (a state where it is not used) or in the ready state, so that the threshold voltage of an NMOST becomes higher, thereby reducing the leakage current so to reduce static power consumption.

When an N-type four-terminal double-insulated-gate field-effect transistor, such as TN1, is used as what is called a pass transistor, by dynamically controlling a threshold voltage of the pass transistor, the resistance can be decreased when the pass transistor is ON and the resistance can be increased when the pass transistor is OFF, so that leakage current can be decreased.

FIG. 1 shows a circuit according to an embodiment of the present invention. The gate electrodes GP1 and GP2 of a P-type four-terminal double-insulated-gate field-effect transistor TP1 are electrically connected to each other and are electrically connected to one gate electrode GN1 of an N-type four-terminal double-insulated-gate field-effect transistor TN1, whereby an input terminal IN is formed.

The other gate electrode GN2 of the N-type four-terminal double-insulated-gate field-effect transistor is connected to a power source VTC for controlling a threshold voltage thereof. Furthermore, the drain electrodes of TP1 and TN1 are connected to each other to form an output terminal OUT. The source electrode of TP1 is connected to, for example, a power source VCC, and the source electrode of TN1 is connected to, for example, a ground GND. Thus, a CMOS inverter circuit is formed.

FIG. 3 shows a second embodiment. A plurality of (two in the figure for simplicity) PMOSTs TP2 and TP3, similar to the PMOST in FIG. 1, are provided. The drain electrodes thereof are electrically connected to each other, and the source electrodes thereof are connected to each other. That is, the PMOSTs TP2 and TP3 are connected in parallel. The same number of NMOSTs TN2 and TN3, similar to the NMOST in FIG. 1, are provided. For example, the source electrode of TN3 is connected to the drain electrode of TN2, i.e., the NMOSTs TN2 and TN3 are connected in series. The gate electrodes of TP2 are electrically connected to one gate electrode of TN2, and the gate electrodes of TP3 are electrically connected to one gate electrode of TN3, whereby two input terminals IN1 and IN2 are formed. The drain electrode of TN3 is connected to the drain electrodes of TP2 and TP3 connected in parallel, whereby an output terminal OUT is formed. The other gate electrodes of TN2 and TN3 are connected to VTC. Thus, a multiple-input (two inputs IN1 and IN2 in the figure) CMOS NAND gate circuit is formed. The other gate electrodes of TN2 and TN3 may be connected to separate power sources for controlling threshold voltages so that different threshold voltages can be used for TN2 and TN3. This serves to stabilize the circuit operation, for example, to alleviate variations in input/output characteristics in a case where inputs are received simultaneously.

FIG. 4 shows a third embodiment. A plurality of (two in the figure for simplicity) PMOSTs TP4 and TP5, similar to the PMOST in FIG. 1, is connected in series, and the same number of NMOSTs TN4 and TN5, similar to the NMOST in FIG. 1, is connected in parallel, whereby a multiple-input (two inputs IN1 and IN2 in the figure) CMOS NOR gate circuit is formed.

Figure 5:
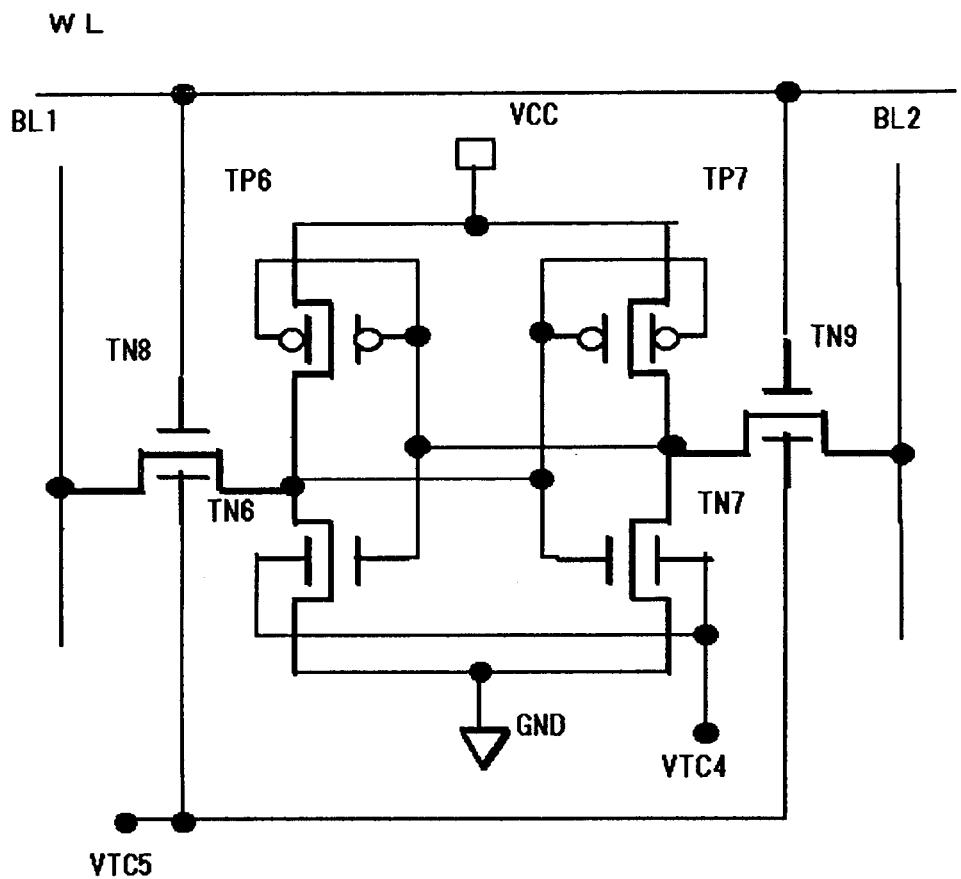
FIG. 5 shows a CMOS SRAM cell circuit according to a fourth embodiment of the present invention.
Figure 6:
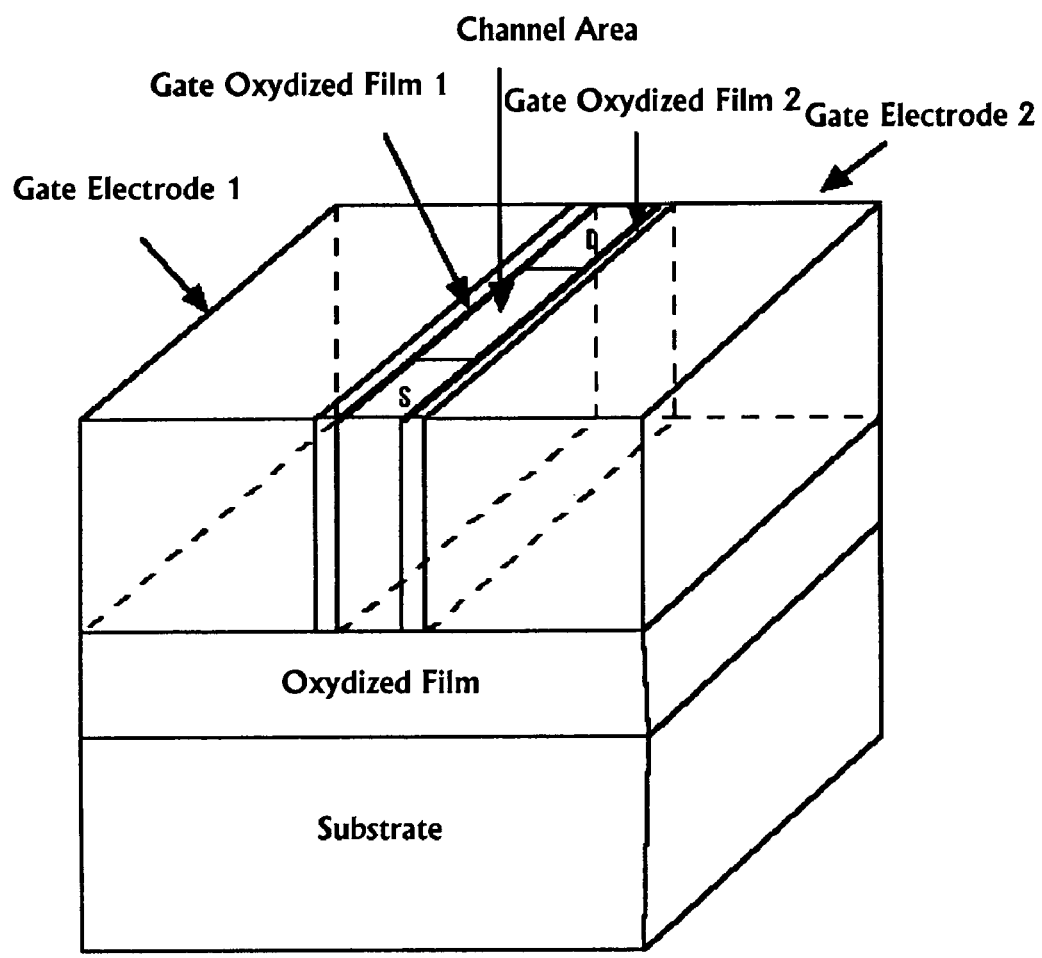
FIG. 6 is a schematic diagram of a conventional four-terminal double-insulated-gate field-effect transistor.

FIG. 5 shows a fourth embodiment according to the present invention. Two CMOS inverter circuits similar to the one shown in FIG. 1, respectively formed by TP6 and TN6 and TP7 and TN7, are used. For example, the output of the CMOS inverter circuit formed by TP6 and TN6 is connected to the input of the CMOS inverter circuit formed of TP7 and TN7, and the output of the latter is connected to the input of the former, i.e., the inputs and outputs are cross-coupled, whereby a flip-flop circuit is formed. Furthermore, NMOSTs TN8 and TN9 similar to TN1 in FIG. 1 are connected in series as pass transistors to the two input terminals, respectively. Thus, a CMOS SRAM cell circuit is formed. In the figure, WL denotes a row selecting line, and BL1 and BL2 denote data lines, which input and output complementary data. The second gate electrodes of TN6 and TN7 are connected to a power source VTC4 for controlling a threshold voltage, and the second gate electrodes of the pass transistors TN8 and TN9 are connected to a power source VTC5 for controlling a threshold voltage. When the cell is in operation, both VTC4 and VTC5 are pulled to such potentials that the threshold voltages of the NMOSTs become lower (this control is exercised at a suitable timing, for example, by increasing the potential of VTC4 in advance). When the cell is idle, the potential of VTC4 is lowered to a minimum limit for maintaining storage, so that threshold voltages of TN6 and TN7 are increased. The same may apply to VTC5 as VTC4. Alternatively, however, the potential may be further decreased to further increase threshold voltages of TN8 and TN9, so that the leakage current that flows through the pass transistors is further reduced. As needed, the second gate electrodes of TN6 to TN9 may be connected to separate power sources for controlling threshold voltages so that threshold voltages can be controlled more precisely in accordance with the operation status of the circuit. Furthermore, when threshold voltages of the pass transistors TN8 and TN9 are suitably set, the second gate electrodes thereof may be connected to the first gate electrodes thereof, respectively.

Furthermore, with the CMOS inverter circuit shown in FIG. 1, the CMOS NAND circuit shown in FIG. 3, the CMOS NOR circuit shown in FIG. 4, and the pass transistors shown in FIG. 5 as basic elements, the advantages and operations of the present invention can be achieved with sequential or combinatorial circuits implemented by combining the basic elements in various ways.

It is said that static power consumption amounts to substantially half of the power consumption of an integrated circuit as chip miniaturization advances. An integrated circuit according to the present invention operates quickly, and static power consumption in the ready state or idle state is reduced.

Thus the present invention possesses a number of advantages or purposes, and there is no requirement that every claim directed to that invention be limited to encompass all of them.

The disclosure of Japanese Patent Application No. 2004-69789 filed on Mar. 11, 2004 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A CMOS circuit comprising:
a P-type four-terminal double-insulated-gate field-effect transistor comprising a first source region, a first drain region, and a first channel region provided between the first source region and the first drain region; a first silicon layer including first and second portions, in which the first channel region are sandwiched between the first and second portions; a first gate oxide film provided on the first portion of the first silicon layer; a first gate electrode provided on the first gate oxide film; a second gate oxide film provided on the second portion of the first silicon layer; and a second gate electrode provided on the second gate oxide film; and
an N-type four-terminal double-insulated-gate field-effect transistor comprising a second source region, a second drain region, and a second channel region provided between the second source region and the second drain region; a second silicon layer including third and fourth portions, in which the second channel region are sandwiched between the third and fourth portions; a third gate oxide film provided on the third portion of the second silicon layer; a third gate electrode provided on the third gate oxide film; a fourth gate oxide film provided on the fourth portion of the second silicon layer; and a fourth gate electrode provided on the fourth gate oxide film
wherein the first and second gate electrodes of the P-type four-terminal double-insulated-gate field-effect transistor are connected to each other and are connected to the third gate electrode of the N-type four-terminal double-insulated-gate field-effect transistor, in order to form an input terminal of the CMOS circuit, and a threshold voltage of the N-type four-terminal double-insulated-gate field-effect transistor is controlled by controlling a potential of the fourth gate electrode of the N-type four-terminal double-insulated-gate field-effect transistor.

2. The CMOS circuit according to claim 1, further including one or more of the P-type four-terminal double-insulated-gate field-effect transistor in which the P-type four-terminal double-insulated-gate filed-effect transistors are connected in parallel to each other, and one or more of the N-type four-terminal double-insulated-gate field-effect transistor in which the N-type four-terminal double-insulated-gate field-effect transistors are connected in series to each other,
wherein the number of the P-type four-terminal double-insulated-gate field-effect transistors is the same as the number of the N-type four-terminal double-insulated-gate field-effect transistors, and the first and second gate electrodes of each of the P-type four-terminal double-insulated-gate field-effect transistors are connected to each other and are connected to the third gate electrode of an associated one of the N-type four-terminal double-insulated-gate field-effect transistors, so that the same number of input terminals is formed, and the fourth gate electrode of each of the N-type four-terminal double-insulated-gate field-effect transistors is connected to a power source for controlling a threshold voltage.

3. The CMOS circuit according to claim 2, wherein a potential of the fourth gate electrode of each N-type four-terminal double-insulated-gate field-effect transistor is controlled dynamically.

4. The CMOS circuit according to claim 3, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

5. The CMOS circuit according to claim 2, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

6. The CMOS circuit according to claim 1, further including one or more of the P-type four-terminal double-insulated-gate field-effect transistor in which the P-type four-terminal double-insulated-gate filed-effect transistors are connected in series to each other, and one or more of the N-type four-terminal double-insulated-gate field-effect transistor in which the N-type four-terminal double-insulated-gate field-effect transistors are connected in parallel to each other,
wherein the number of the P-type four-terminal double-insulated-gate field-effect transistors is the same as the number of the N-type four-terminal double-insulated-gate field-effect transistors, and the first and second electrodes of each of the P-type four-terminal double-insulated-gate field-effect transistors are connected to each other and are connected to the third gate electrode of an associated one of the N-type four-terminal double-insulated-gate field-effect transistors, so that the same number of input terminals is formed, and the fourth gate electrode of each of the N-type four-terminal double-insulated-gate field-effect transistors is connected to a power source for controlling a threshold voltage.

7. The CMOS circuit according to claim 6, wherein a potential of the fourth gate electrode of each N-type four-terminal double-insulated gate field-effect transistor is controlled dynamically.

8. The CMOS circuit according to claim 7, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

9. The CMOS circuit according to claim 6, wherein gate electrode material of the third and forth gate electrodes of each N-type four-terminal double-insulated-gate field-effect transistor is the same as that of the first and second gate-electrodes of each of the P-type four-terminal double-insulated-gate field effect transistors.

10. The CMOS circuit according to claim 1, wherein two of the CMOS circuits are cross-coupled to form a flip-flop circuit,
two pass transistors which are N-type four-terminal double-insulated-gate field-effect transistors are connected to respective input terminals of the two CMOS circuits,
the other ends of the two CMOS circuits are connected to data lines, and
fifth and sixth gate electrodes of each of the pass transistors are connected to a row selecting line.

11. The CMOS circuit according to claim 10, wherein the sixth electrode of each of the pass transistors is connected to a power source for controlling a threshold voltage of the pass transistor.

12. The CMOS circuit according to claim 11, wherein a potential of the fourth gate electrode of each N-type four-terminal double-insulated-gate field-effect transistor is controlled dynamically.

13. The CMOS circuit according to claim 11, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

14. The CMOS circuit according to claim 10, wherein a potential of the fourth gate electrode of each N-type four-terminal double-insulated-gate field-effect transistor is controlled dynamically.

15. The CMOS circuit according to claim 14, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

16. The CMOS circuit according to claim 10, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

17. The CMOS circuit according to claim 1, wherein a potential of the fourth gate electrode of each N-type four-terminal double-insulated-gate field-effect transistor is controlled dynamically.

18. The CMOS circuit according to claim 17, wherein gate electrode material of the third and forth gate electrodes of each N-type four-terminal double-insulated-gate field-effect transistor is the same as that of the first and second gate electrodes of each of the P-type four-terminal double-insulated-gate field effect transistors.

19. The CMOS circuit according to claim 1, wherein gate electrode material of the third and forth gate electrodes of each N-type four-terminal double-insulated-gate field-effect transistor is the same as that of the first and second gate electrodes of each P-type four-terminal double-insulated-gate field effect transistor.

20. An integrated circuit comprising at least one of the CMOS circuits according to claim 1.

* * * * *